United States Patent
Paik et al.

(10) Patent No.: US 11,336,313 B2
(45) Date of Patent: May 17, 2022

(54) DATA TRANSMISSION CIRCUIT

(71) Applicant: Silicon Works Co., Ltd., Daejeon (KR)

(72) Inventors: Sang Hoon Paik, Daejeon (KR); Jeong Hoon Nam, Daejeon (KR); Yong Hwan Moon, Daejeon (KR)

(73) Assignee: Silicon Works Co., Ltd, Daejeon (KR)

( * ) Notice: Subject to any disclaimer, the term of this patent is extended or adjusted under 35 U.S.C. 154(b) by 58 days.

(21) Appl. No.: 17/030,654

(22) Filed: Sep. 24, 2020

(65) Prior Publication Data

US 2021/0091804 A1 Mar. 25, 2021

(30) Foreign Application Priority Data

Sep. 24, 2019 (KR) .................. 10-2019-0117186

(51) Int. Cl.
*H04B 1/04* (2006.01)
*H03K 17/687* (2006.01)

(52) U.S. Cl.
CPC ........... *H04B 1/04* (2013.01); *H03K 17/6872* (2013.01)

(58) Field of Classification Search
CPC ............ H03K 3/00; H03K 3/012; H03K 5/12; H03K 5/22; H03K 17/00; H03K 17/10; H03K 17/60; H03K 17/687; H03K 17/6872; H03K 19/003; H03K 19/094; H03K 19/0175; H03K 19/0185; H03L 5/00; H04B 1/00; H04B 1/04; H04B 3/00; H04L 7/00; H04L 27/00

USPC ............... 326/27, 70, 87, 115; 327/65, 99, 327/108–112; 375/219, 295–297
See application file for complete search history.

(56) References Cited

U.S. PATENT DOCUMENTS

| | | | |
|---|---|---|---|
| 6,975,132 B2 * | 12/2005 | Groen | H04L 25/0282 326/27 |
| 9,647,666 B1 * | 5/2017 | Oh | H03K 19/018521 |
| 10,734,974 B1 * | 8/2020 | Jagannathan | H03F 3/2171 |
| 2003/0085736 A1 | 5/2003 | Tinsley et al. | |

FOREIGN PATENT DOCUMENTS

| | | |
|---|---|---|
| KR | 20030069783 B1 | 8/2003 |
| KR | 201000247079 B1 | 2/2010 |
| KR | 20130011173 A | 1/2013 |

* cited by examiner

*Primary Examiner* — Shawkat M Ali
(74) *Attorney, Agent, or Firm* — Polsinelli PC

(57) ABSTRACT

A data transmission circuit which is improved to be capable of supporting a data transmission mode appropriate for an interface or an application depending on the selection of an option. The data transmission circuit includes a pre-driver configured to output a first differential driving signal, a second differential driving signal and pre-emphasis control signals by using a first differential data signal, a second differential data signal and option signals; a main driver configured to output a first differential transmission signal and a second differential transmission signal by using the first differential driving signal and the second differential driving signal; and a pre-emphasis driver configured to perform pre-emphasis on the first differential transmission signal and the second differential transmission signal to different amplification degrees in a first mode and a second mode by the pre-emphasis control signals.

19 Claims, 7 Drawing Sheets

DATA TRANSMISSION CIRCUIT

BACKGROUND

1. Technical Field

Various embodiments generally relate to a data transmission circuit, and more particularly, to a data transmission circuit which is improved to be capable of supporting a data transmission mode appropriate for an interface or an application depending on the selection of an option.

2. Related Art

In general, a display device includes a data transmission circuit such as a timing controller and a data reception circuit such as a source driver.

A data transmission scheme between them may be implemented in various ways depending on an interface or an application. As the data transmission scheme, a low voltage differential signaling (LVDS) scheme and a current mode logic (CML) scheme may be exemplified.

The data transmission circuit should output transmission data in a scheme in which the data reception circuit may receive the transmission data. For example, in the case where the driver as the data reception circuit is capable of receiving transmission data of the LVDS scheme, the transmission data should be outputted in the LVDS scheme from the data transmission circuit. Further, in the case where the driver is capable of receiving transmission data of the CML scheme, the transmission data should be outputted in the CML scheme from the data transmission circuit.

The data transmission circuit is required to have a combo function to be compatible with the interface or the application, and needs to be designed to be capable of supporting a plurality of data transmission schemes by the combo function and outputting transmission data in a selected data transmission scheme.

SUMMARY

Various embodiments are directed to a data transmission circuit which can output a transmission signal in a data transmission scheme according to a selected option, thereby having compatibility with an interface or an application.

In an embodiment, a data transmission circuit may include: a pre-driver configured to output a first differential driving signal and a second differential driving signal by using a first differential data signal and a second differential data signal; and a main driver configured to output a first differential transmission signal and a second differential transmission signal by using the first differential driving signal and the second differential driving signal, wherein the main driver performs output of a high level and output of a low level in correspondence to a first mode, by using a first high level output circuit and a low level output circuit which are operated by the first differential driving signal and the second differential driving signal, wherein the main driver performs output of a high level and output of a low level in correspondence to a second mode, by using a second high level output circuit which uses internal termination resistors and the low level output circuit which is operated by the first differential driving signal and the second differential driving signal, and wherein the main driver includes a current source which provides current paths having different current capacities to the low level output circuit shared by the first high level output circuit and the second high level output circuit, depending on a mode.

In an embodiment, a data transmission circuit may include: a pre-driver configured to output a first differential driving signal, a second differential driving signal and pre-emphasis control signals by using a first differential data signal, a second differential data signal and option signals; a main driver configured to output a first differential transmission signal and a second differential transmission signal by using the first differential driving signal and the second differential driving signal; and a pre-emphasis driver configured to perform pre-emphasis on the first differential transmission signal and the second differential transmission signal to different amplification degrees in a first mode and a second mode by the pre-emphasis control signals, wherein the main driver performs output of a high level and output of a low level in correspondence to the first mode, by using a first high level output circuit and a low level output circuit which are operated by the first differential driving signal and the second differential driving signal, wherein the main driver performs output of a high level and output of a low level in correspondence to the second mode, by using a second high level output circuit which uses internal termination resistors and the low level output circuit which is operated by the first differential driving signal and the second differential driving signal, and wherein the main driver includes a current source which provides current paths having different current capacities to the low level output circuit shared by the first high level output circuit and the second high level output circuit, depending on a mode.

According to the embodiments of the disclosure, an option may be selected in consideration of an interface or an application, and a combo function for outputting a transmission signal in a mode according to the option may be provided.

Therefore, the data transmission circuit according to the embodiments of the disclosure may have compatibility with the interface or the application.

In addition, according to the embodiments of the disclosure, it is possible to support an LVDS mode and a CML mode by selection, to reduce the sizes of chips by sharing some circuits, and to provide current paths having different current capacities depending on a change in mode and whether to apply pre-emphasis or not.

DETAILED DESCRIPTION

Figure 1:
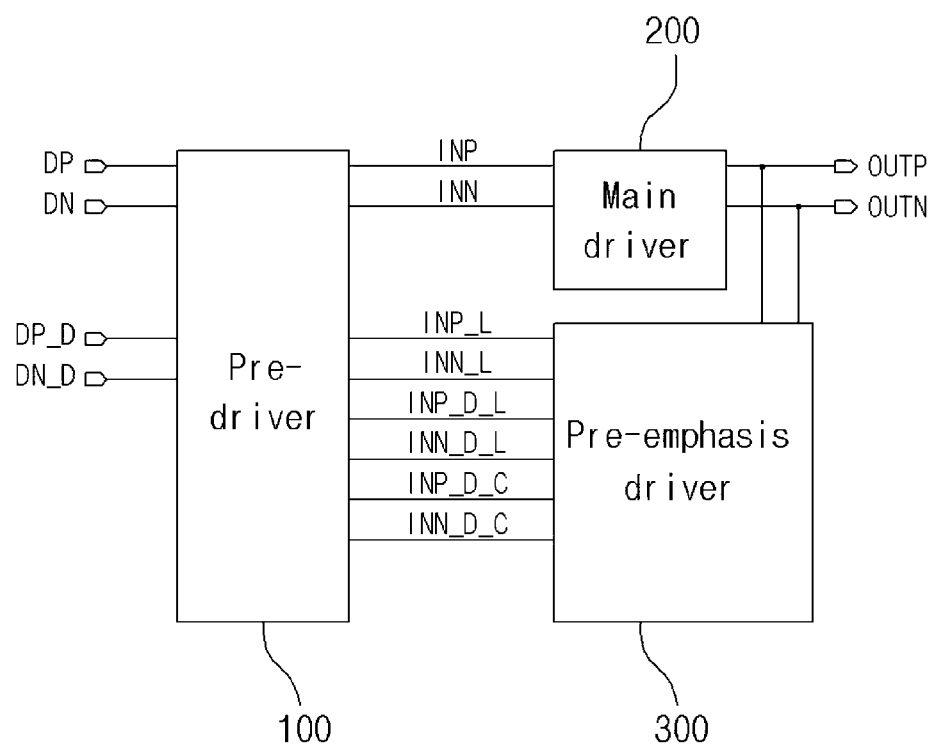
FIG. 1 is a block diagram illustrating a representation of an example of a data transmission circuit in accordance with an embodiment of the disclosure.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

A display device displays an image through a display panel, and includes a driver for driving the display panel and a timing controller for providing display data to the driver.

The driver and the timing controller may be configured by separate chips, respectively. Of them, the timing controller corresponds to a data transmission circuit, and the driver corresponds to a data reception circuit.

An interface scheme between the data transmission circuit and the data reception circuit may be limited to a specific scheme such as a low voltage differential signaling (LVDS) scheme or a current mode logic (CML) scheme. Further, the data reception circuit may also be configured to restore a signal in a specific scheme such as the LVDS scheme or the CML scheme. The LVDS scheme or the CML scheme is an interface scheme of transmitting differential signals, and signals outputted from the data transmission circuit by the LVDS scheme or CML scheme may be defined as differential transmission signals.

A data transmission circuit implemented by the present disclosure supports a plurality of data transmission schemes, is configured in a combo type capable of selecting a data transmission scheme, and has compatibility with an interface scheme or an application.

An embodiment of the data transmission circuit of the present disclosure is configured to be able to select one of two data transmission modes by an option. The two data transmission modes may be exemplarily defined as modes that require different current capacities. As the two data transmission modes, an LVDS mode and a CML mode may be exemplified. For the sake of convenience in explanation, the LVDS mode is defined as a first mode, and the CML mode is defined as a second mode.

Referring to FIG. 1, a data transmission circuit in accordance with an embodiment of the disclosure is illustrated as including a pre-driver 100, a main driver 200, and a pre-emphasis driver 300.

The pre-driver 100 is configured to receive a first differential data signal DP, a second differential data signal DN and option signals DP_D and DN_D and output a first differential driving signal INP, a second differential driving signal INN and pre-emphasis control signals INP_L, INN_L, INP_D_L, INN_D_L, INP_D_C and INN_D_C.

The main driver 200 is configured to receive the first differential driving signal INP and the second differential driving signal INN and output a first differential transmission signal OUTP and a second differential transmission signal OUTN.

The pre-emphasis driver 300 is configured to receive the pre-emphasis control signals INP_L, INN_L, INP_D_L, INN_D_L, INP_D_C and INN_DC and perform pre-emphasis on the first differential transmission signal OUTP and the second differential transmission signal OUTN.

The disclosure may be configured to further include an external memory (not illustrated) which stores option signals for selecting an option, and the external memory may be implemented by a memory such as an EEPROM which is configured separately from the data transmission circuit. The external memory may be configured to provide option signals for selecting a mode, by a request of the data transmission circuit.

Figure 2:
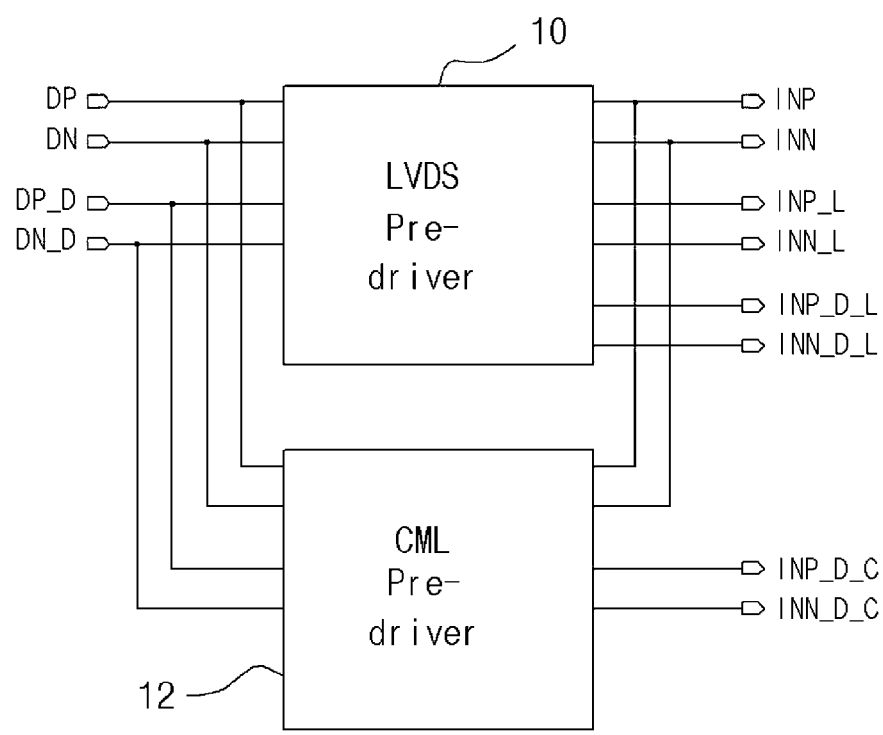
FIG. 2 is a detailed block diagram illustrating a representation of an example of a pre-driver illustrated in FIG. 1.

In FIGS. 1 and 2, DP_D and DN_D are illustrated as option signals. However, the disclosure is not limited thereto. Enable signals EN and ENB for identifying the first mode and the second mode, enable signals PE_EN and PE_ENB for controlling pre-emphasis, and switching signals MS and MS_PE for switching control according to the second mode or pre-emphasis may be included in the option signals. FIGS. 1 and 2 illustrate DP_D and DN_D representing the option signals, and FIGS. 3 to 7 illustrate various option signals in respective parts.

Hereinafter, the configuration of each driver will be described in more detail.

Figure 3:
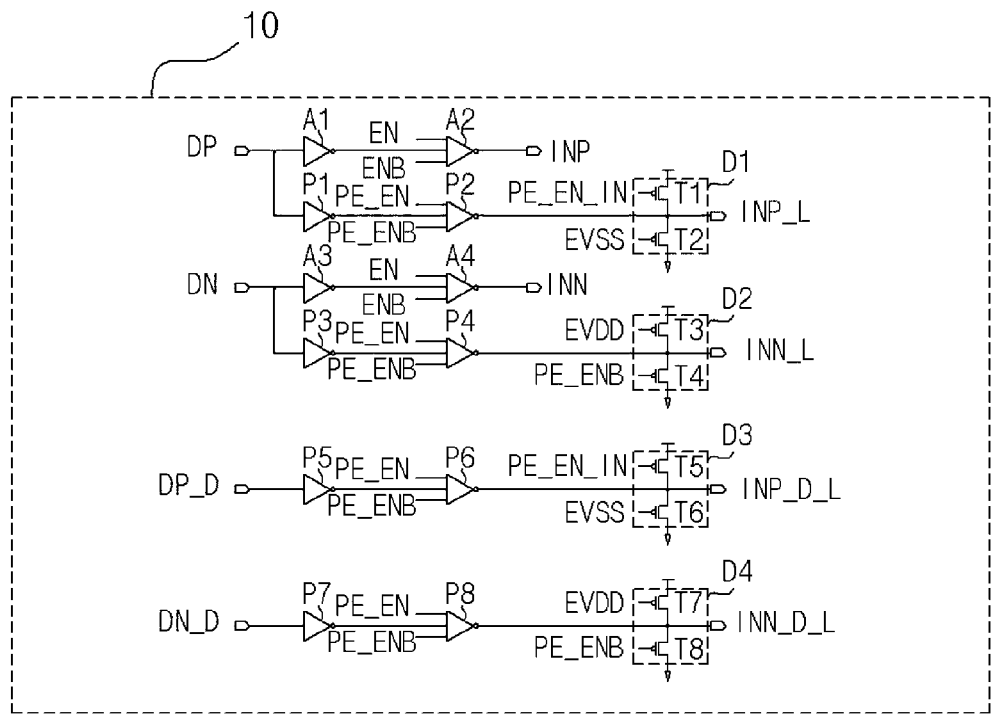
FIG. 3 is a detailed circuit diagram of FIG. 2.
Figure 3:
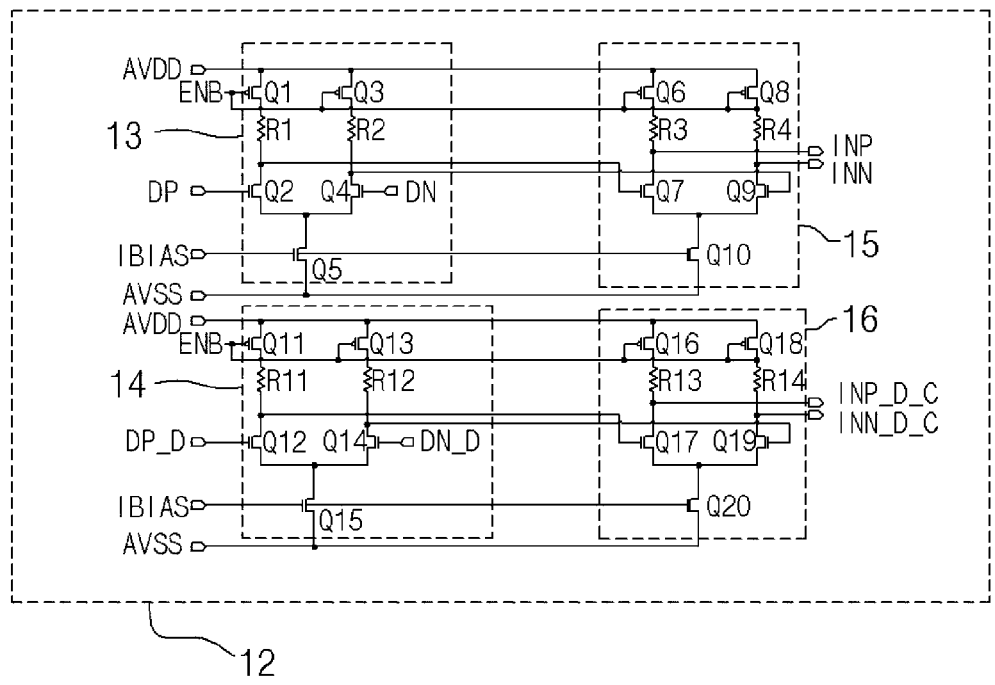

FIGS. 2 and 3 illustrate a detailed block diagram and a detailed circuit diagram of the pre-driver 100 of FIG. 1, respectively.

The pre-driver 100 is configured to receive the first differential data signal DP, the second differential data signal DN and the option signals DP_D and DN_D.

Further, the pre-driver 100 is configured to output the first differential driving signal INP and the second differential driving signal INN by using the first differential data signal DP and the second differential data signal DN. Moreover, the pre-driver 100 is configured to output the pre-emphasis control signals INP_L, INN_L, INP_D_L, INN_D_L, INP_D_C and INN_D_C by using the first differential data signal DP, the second differential data signal DN and the option signals DP_D and DN_D.

Among the pre-emphasis control signals INP_L, INN_L, INP_D_L, INN_D_L, INP_D_C and INN_D_C, the pre-emphasis control signals INP_L, INN_L, INP_D_L and INN_D_L are used for the first mode in such a way to be activated in the first mode, and the pre-emphasis control signals INP_D_C and INN_D_C are used for the second mode in such a way to be activated in the second mode.

More specifically, the pre-driver 100 includes an LVDS pre-driver 10 and a CML pre-driver 12 as illustrated in FIG. 2. The LVDS pre-driver 10 may be understood as a first mode pre-driver, and the CML pre-driver 12 may be understood as a second mode pre-driver.

The LVDS pre-driver 10 and the CML pre-driver 12 may determine whether to apply the first mode, the second mode and pre-emphasis, by the above-described option signals including the option signals DP_D and DN_D.

The LVDS pre-driver 10 is enabled in correspondence to the first mode, amplifies the first differential data signal DP and the second differential data signal DN to satisfy a first specification, and outputs the first differential driving signal INP and the second differential driving signal INN. The LVDS pre-driver 10 outputs the pre-emphasis control signals INP_L, INN_L, INP_D_L and INN_D_L for pre-emphasis corresponding to the first differential data signal DP, the second differential data signal DN and the option signals DP_D and DN_D.

The CML pre-driver 12 is enabled in response to the second mode, amplifies the first differential data signal DP and the second differential data signal DN to satisfy a second specification, and outputs the first differential driving signal INP and the second differential driving signal INN. The CML pre-driver 12 outputs the pre-emphasis control signals INP_D_C and INN_D_C for pre-emphasis corresponding to the option signals DP_D and DN_D.

In the above descriptions, the first specification and the second specification mean limits on voltage characteristics and current characteristics defined in the respective modes. The amplification in the LVDS pre-driver 10 and the CML pre-driver 12 may include transferring signals by maintaining the levels of original signals through buffering.

With reference to FIG. 3, detailed configurations of the LVDS pre-driver 10 and the CML pre-driver 12 will be described.

The LVDS pre-driver 10 includes inverters A1 and A2 which are configured by amplifiers, to output the first differential driving signal INP in correspondence to the first differential data signal DP.

The inverter A1 is for inverting and amplifying an input, and the inverter A2 is for inverting and amplifying an input. The operation of the inverter A2 may be enabled or disabled depending on states of the enable signals EN and ENB. The inverter A2 may be understood as being enabled in the first mode. By the above configuration, the first differential data signal DP may be amplified through the inverters A1 and A2, and the first differential driving signal INP may be outputted from the inverter A2. In the second mode, the output of the first differential driving signal INP is disabled.

The LVDS pre-driver 10 includes inverters A3 and A4 which are configured by amplifiers, to output the second differential driving signal INN in correspondence to the second differential data signal DN.

The inverter A3 is for inverting and amplifying an input, and the inverter A4 is for inverting and amplifying an input. The operation of the inverter A4 may be enabled or disabled depending on states of the enable signals EN and ENB. The inverter A4 may be understood as being enabled in the first mode. By the above configuration, the second differential data signal DN may be amplified through the inverters A3 and A4, and the second differential driving signal INN may be outputted from the inverter A4. In the second mode, the output of the second differential driving signal INN is disabled.

The LVDS pre-driver 10 includes inverters P1 and P2 and an output circuit D1 to output the pre-emphasis control signal INP_L in correspondence to the first differential data signal DP.

The inverter P1 is for inverting and amplifying an input, and the inverter P2 is for inverting and amplifying an input. The operation of the inverter P2 may be enabled or disabled depending on states of the pre-emphasis enable signals PE_EN and PE_ENB. The inverter P2 may be understood as being enabled in the case where pre-emphasis is applied to the first differential transmission signal OUTP and the second differential transmission signal OUTN.

The output circuit D1 includes a PMOS transistor T1 for the output of a high level and a PMOS transistor T2 for the output of a low level. The output circuit D1 drives the output of the inverter P2, applied to a node between the transistors T1 and T2, by a high level output driving signal PE_EN_IN and a low level output driving signal EVSS, and outputs the pre-emphasis control signal INP_L. By the above configuration, the first differential data signal DP may be amplified through the inverters P1 and P2 and be driven by the output circuit D1, and as a result, the pre-emphasis control signal INP_L may be outputted from the output circuit D1.

The LVDS pre-driver 10 includes inverters P3 and P4 and an output circuit D2 to output the pre-emphasis control signal INN_L in correspondence to the second differential data signal DN. The LVDS pre-driver 10 includes inverters P5 and P6 and an output circuit D3 to output the pre-emphasis control signal INP_D_L in correspondence to the option signal DP_D. The LVDS pre-driver 10 includes inverters P7 and P8 and an output circuit D4 to output the pre-emphasis control signal INN_D_L in correspondence to the option signal DN_D.

In the above configurations, since the inverters P3 and P4; P5 and P6; and P7 and P8 are configured in the same manner as the inverters P1 and P2, repeated description thereof is omitted. The output circuits D2 and D4 are different from the output circuit D1 in that they output the pre-emphasis control signals INN_L and INN_D_L which swing between high levels and low levels by a driving signal EVDD and the pre-emphasis enable signal PE_ENB. The output circuit D3 is different from the output circuit D1 in that it outputs the pre-emphasis control signal INP_D_L.

The CML pre-driver 12 includes amplifiers 13 and 15 of two stages. The amplifiers 13 and 15 of two stages are enabled in correspondence to the second mode, and are configured to differentially amplify the first differential data signal DP and the second differential data signal DN and output the first differential driving signal INP and the second differential driving signal INN. Further, the CML pre-driver 12 includes amplifiers 14 and 16 of two stages. The amplifiers 14 and 16 of two stages are enabled in correspondence to the second mode, and are configured to differentially amplify the option signals DP_D and DN_D and output the pre-emphasis control signals INP_D_C and INN_D_C for pre-emphasis.

The amplifier 13 includes a PMOS transistor Q1, a resistor R1 and an NMOS transistor Q2 which are connected in series. The amplifier 13 includes a PMOS transistor Q3, a resistor R2 and an NMOS transistor Q4 which are connected in series. The amplifier 13 includes a driving NMOS transistor Q5 which is connected to the NMOS transistors Q2 and Q4. Among them, the PMOS transistors Q1 and Q3 are configured to be controlled by the enable signal ENB in transferring an operating voltage AVDD to the respective resistors R1 and R2 in the second mode, and the NMOS transistor Q5 is configured to be controlled by a bias control signal IBIAS in applying a ground voltage AVSS to the NMOS transistors Q2 and Q4.

The amplifier 15 includes a PMOS transistor Q6, a resistor R3 and an NMOS transistor Q7 which are connected in series. The amplifier 15 includes a PMOS transistor Q8, a resistor R4 and an NMOS transistor Q9 which are connected in series. The amplifier 15 includes a driving NMOS transistor Q10 which is connected to the NMOS transistors Q7 and Q9. Since the structure of the amplifier 15 is the same as that of the amplifier 13, repeated description thereof is omitted.

The amplifier 13 configured as described above performs differential amplification by the first differential data signal DP and the second differential data signal DN applied to the NMOS transistors Q2 and Q4 in the second mode. A voltage of a node between the resistor R1 and the NMOS transistor Q2 is applied to the gate of the NMOS transistor Q7 of the amplifier 15, and a voltage of a node between the resistor R2 and the NMOS transistor Q4 is applied to the gate of the NMOS transistor Q9 of the amplifier 15. The amplifier 15 performs differential amplification in the same manner as the amplifier 13 in the second mode, and thereby, outputs the first differential driving signal INP through a node between the resistor R3 and the NMOS transistor Q7 and outputs the second differential driving signal INN through a node between the resistor R4 and the NMOS transistor Q9.

The amplifier 14 includes a PMOS transistor Q11, a resistor R11 and an NMOS transistor Q12 which are connected in series. The amplifier 14 includes a PMOS transistor Q13, a resistor R12 and an NMOS transistor Q14 which are connected in series. The amplifier 14 includes a driving NMOS transistor Q15 which is connected to the NMOS transistors Q12 and Q14.

The amplifier 16 includes a PMOS transistor Q16, a resistor R13 and an NMOS transistor Q17 which are connected in series. The amplifier 16 includes a PMOS transistor Q18, a resistor R14 and an NMOS transistor Q19 which are connected in series. The amplifier 16 includes a driving NMOS transistor Q20 which is connected to the NMOS transistors Q17 and Q19. Since the structures of the amplifiers 14 and 16 are the same as those of the amplifiers 13 and 15, repeated description thereof is omitted.

The amplifiers 14 and 16 differentially amplify the option signals DP_D and DN_D in two stages in correspondence to the second mode, and then, output the option signals DP_D and DN_D as the pre-emphasis control signals INP_D_C and INN_D_C.

Figure 4:
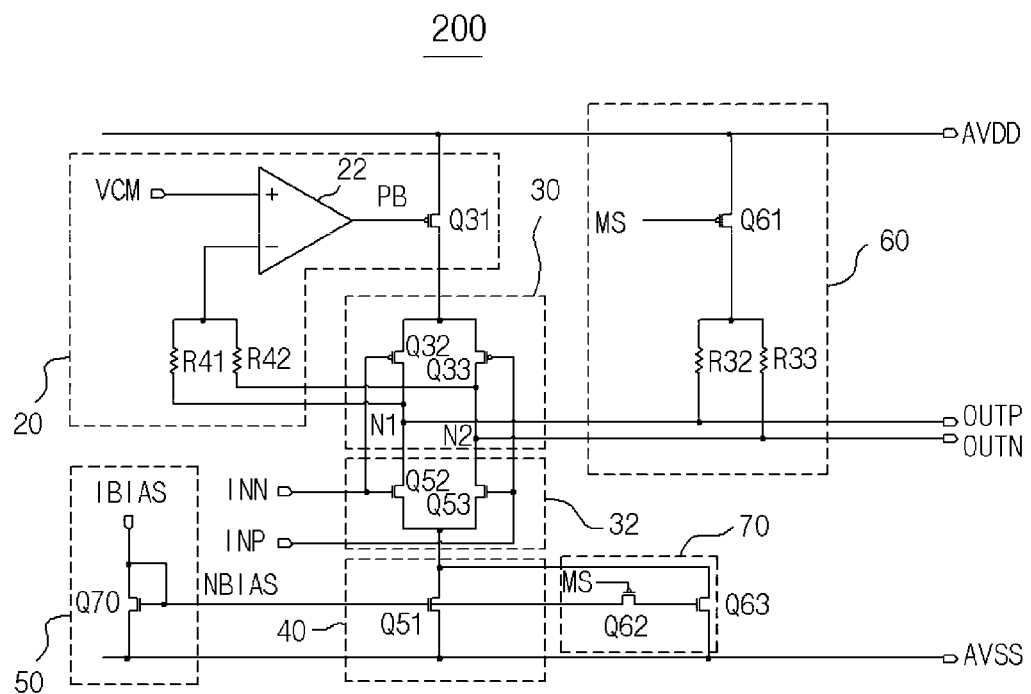
FIG. 4 is a detailed circuit diagram illustrating a representation of an example of a main driver illustrated in FIG. 1.

The main driver 200 will be described below with reference to FIG. 4.

The main driver 200 receives the first differential driving signal INP and the second differential driving signal INN provided from the LVDS pre-driver 10 in the first mode or from the CML pre-driver 12 in the second mode. The main driver 200 outputs the first differential transmission signal OUTP and the second differential transmission signal OUTN by using the first differential driving signal INP and the second differential driving signal INN.

More specifically, the main driver 200 performs the output of a high level and the output of a low level in correspondence to the first mode, by using a first high level output circuit 30 and a low level output circuit 32 which are operated by the first differential driving signal INP and the second differential driving signal INN. Further, the main driver 200 performs the output of a high level and the output of a low level in correspondence to the second mode, by using a second high level output circuit 60 which uses internal termination resistors R32 and R33 and the low level output circuit 32 which is operated by the first differential driving signal INP and the second differential driving signal INN.

The main driver 200 may include a current source which provides current paths having different current capacities to the low level output circuit 32, shared by the first high level output circuit 30 and the second high level output circuit 60, depending on a mode. The current source may be understood as including a first current source 40 and a second current source 70 which are connected to the low level output circuit 32. The first current source 40 provides a first current path having a first current capacity to the low level output circuit 32. The second current source 70 is enabled in the second mode, and provides a second current path having a second current capacity to the low level output circuit 32 in parallel with the first current source 40.

In the above-described configuration, the second high level output circuit 60 has a fixed high level output capacity which is determined by the internal termination resistors R32 and R33.

The configuration of the main driver 200 will be described below in more detail.

The main driver 200 includes the first high level output circuit 30, a feedback circuit 20, the second high level output circuit 60, the low level output circuit 32, the current source including the first current source 40 and the second current source 70, and a bias signal providing unit 50.

In the main driver 200, the operating voltage AVDD is used as a high level output voltage, and the ground voltage AVSS is used as a low level output voltage. In the following description, the operating voltage AVDD is described as a high level output voltage AVDD, and the ground voltage AVSS is described as a low level output voltage AVSS.

In the first mode, the first high level output circuit 30 receives the high level output voltage AVDD through the feedback circuit 20, and performs a high level output operation by the first differential driving signal INP and the second differential driving signal INN. To this end, the first high level output circuit 30 includes a PMOS transistor Q33 which receives the high level output voltage AVDD and is operated by the first differential driving signal INP, and a PMOS transistor Q32 which receives the high level output voltage AVDD in parallel with the PMOS transistor Q33 and is operated by the second differential driving signal INN.

The feedback circuit 20 feeds back the first differential transmission signal OUTP and the second differential transmission signal OUTN, and blocks the high level output voltage AVDD from being applied to the first high level output circuit 30 in the second mode in which a feedback voltage is higher than a reference voltage VCM.

To this end, the feedback circuit 20 includes resistors R41 and R42, a comparator 22, and a PMOS transistor Q31. The resistor R41 is connected to a first node N1 which is formed at the drain of the PMOS transistor Q32, and is applied with the first differential transmission signal OUTP which is outputted from the first node N1. The resistor R42 is connected to a second node N2 which is formed at the drain of the PMOS transistor Q33, and is applied with the second differential transmission signal OUTN which is outputted from the second node N2. The comparator 22 is configured to have a positive input terminal (+) to which the reference voltage VCM is applied, a negative input terminal (−) to which the feedback voltage fed back through the resistor R41 and the resistor R42 is applied, and an output terminal which outputs a comparison signal PB to the gate of the PMOS transistor Q31.

The feedback voltage may be understood as a voltage which is applied through the resistors R41 and R42 connected in parallel. The PMOS transistor Q31 is controlled in its switching by the comparison signal PB, and switches the transfer of the high level output voltage AVDD to the first high level output circuit 30.

By the above configuration, the feedback circuit 20 turns on the PMOS transistor Q31 and transfers the high level output voltage AVDD to the first high level output circuit 30 in the case of the first mode in which the reference voltage VCM is higher than the feedback voltage, and turns off the PMOS transistor Q31 and blocks the high level output voltage AVDD from being transferred to the first high level output circuit 30 in the case of the second mode in which the feedback voltage is higher than the reference voltage VCM.

The second high level output circuit 60 includes a PMOS transistor Q61 and the internal termination resistors R32 and R33, and is configured to perform a high level output operation using the internal termination resistors R32 and R33 as, in the second mode, the PMOS transistor Q61 is turned on and thus the high level output voltage AVDD is applied to the internal termination resistors R32 and R33.

The PMOS transistor Q61 is controlled in its operation by the switching signal MS applied to the gate thereof. The switching signal MS maintains a low level and turns on the PMOS transistor Q61 in the case of the second mode, and maintains a high level and turns off the PMOS transistor Q61 in the case of the first mode.

The internal termination resistor R32 is connected to the first node N1, and the internal termination resistor R33 is connected to the second node N2. The second high level output circuit 60 has a fixed output capacity which is determined by the internal termination resistors R32 and R33 having fixed resistance values, and thus, is advantageous for a high-speed operation.

The low level output circuit 32 is shared by the first high level output circuit 30 and the second high level output circuit 60 through the first node N1 and the second node N2. The low level output circuit 32 performs a low level output operation by the first differential driving signal INP and the second differential driving signal INN.

To this end, the low level output circuit 32 includes NMOS transistors Q52 and Q53 which are configured in parallel. The NMOS transistor Q52 is configured to have a drain which is connected in common to the drain of the PMOS transistor Q32 and the internal termination resistor R32 through the first node N1, and a gate to which the second differential driving signal INN is applied. The NMOS transistor Q53 is configured to have a drain which is connected in common to the drain of the PMOS transistor Q33 and the internal termination resistor R33 through the second node N2, and a gate to which the first differential driving signal INP is applied.

The NMOS transistor Q52 and the NMOS transistor Q53 are configured such that they are driven by the first differential driving signal INP and the second differential driving signal INN to output low levels and the sources thereof are connected to the current sources 40 and 70.

The current source is configured to provide current paths, having different current capacities in correspondence to the first mode and the second mode, to the low level output circuit 32. To this end, the current source includes the first current source 40 and the second current source 70. In order for the operations of the first current source 40 and the second current source 70, the bias signal providing unit 50 which provides a bias signal NBIAS is configured.

The first current source 40 includes an NMOS transistor Q51 to the gate of which the bias signal NBIAS is applied. The NMOS transistor Q51 is connected in common to the sources of the NMOS transistors Q52 and Q53 of the low level output circuit 32, and provides, by being turned on, a current path to the low level output circuit 32. The first current source 40 provides the current path by maintaining the turned-on state in both the first mode and the second mode.

The second current source 70 includes a PMOS transistor Q62 to the gate of which the switching signal MS is applied, and an NMOS transistor Q63 for providing a current path to the low level output circuit 32. The switching signal MS turns on the PMOS transistor Q62 in the second mode. If the PMOS transistor Q62 is turned on, the NMOS transistor Q63 is turned on by the bias signal NBIAS applied to the gate thereof, thereby providing the current path. The second current source 70 is turned off in the first mode, and is turned on in the second mode, thereby providing the current path formed in parallel with the current path of the first current source 40.

The bias signal providing unit 50 is for providing the bias signal NBIAS to the first current source 40 and the second current source 70. The bias signal providing unit 50 is configured to include an NMOS transistor Q70. The NMOS transistor Q70 is configured such that a bias control signal IBIAS is supplied to the drain thereof and the drain and the gate thereof are connected, and provides the bias signal NBIAS to the first current source 40 and the second current source 70.

Figure 5:
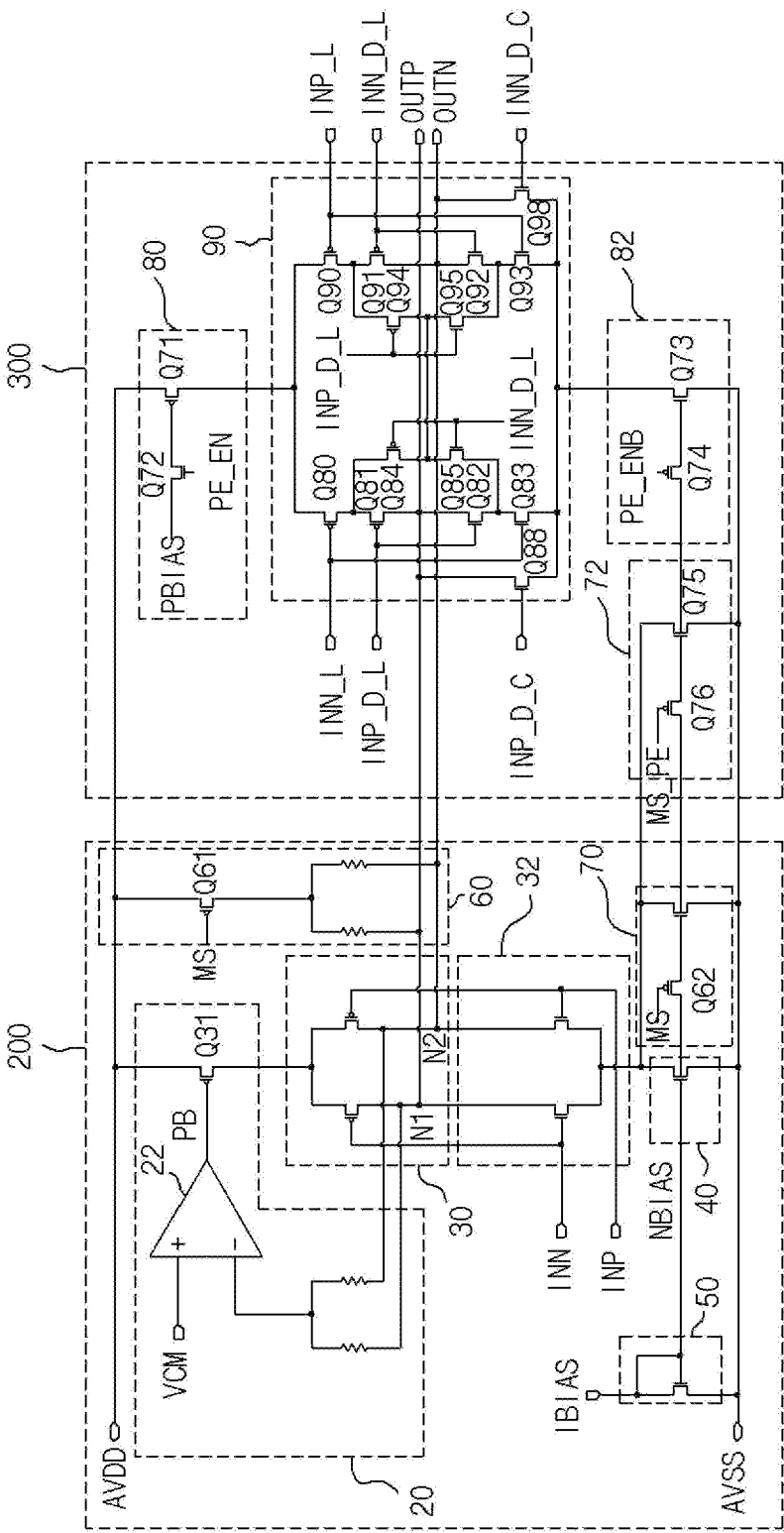
FIG. 5 is a detailed circuit diagram illustrating a representation of an example of a combined state of the main driver and a pre-emphasis circuit illustrated in FIG. 1.

The pre-emphasis driver 300 of FIG. 1 will be described below with reference to FIG. 5.

The pre-emphasis driver 300 performs pre-emphasis on the first differential transmission signal OUTP and the second differential transmission signal OUTN to different amplification degrees in the first mode and the second mode by the pre-emphasis control signals INP_L, INN_L, INP_D_L, INN_D_L, INP_D_C and INN_D_C.

The pre-emphasis driver 300 may be configured to include a first bias circuit 80, a second bias circuit 82, an amplification circuit 90, and a third current source 72 for pre-emphasis.

Among them, the amplification circuit 90 includes a first amplification circuit for pre-emphasis in the first mode and a second amplification circuit for pre-emphasis in the second mode.

First, when pre-emphasis is enabled, the first bias circuit 80 transfers the high level output voltage AVDD to the first amplification circuit of the amplification circuit 90.

To this end, the first bias circuit 80 includes an NMOS transistor Q72 which switches the transfer of a bias signal PBIAS by the enable signal PE_EN for controlling pre-emphasis, and a PMOS transistor Q71 which is turned on when the bias signal PBIAS is applied to the gate thereof and thereby transfers the high level output voltage AVDD to the amplification circuit 90. The PMOS transistor Q71 of the first bias circuit 80 is configured to be connected in common to a PMOS transistor Q80 and a PMOS transistor Q90 of the amplification circuit 90 and transfer the high level output voltage AVDD. Pre-emphasis in the first bias circuit 80 is enabled as the bias signal PBIAS is transferred to the gate of the PMOS transistor Q71 by the activation of the enable signal PE_EN.

When pre-emphasis is enabled, the second bias circuit 82 transfers the low level output voltage AVSS to the first amplification circuit and the second amplification circuit of the amplification circuit 90.

To this end, the second bias circuit 82 includes a PMOS transistor Q74 which switches the transfer of the bias signal NBIAS by the enable signal PE_ENB for controlling pre-emphasis, and an NMOS transistor Q73 which is turned on when the bias signal NBIAS is applied to the gate thereof and thereby transfers the low level output voltage AVSS to the amplification circuit 90. The NMOS transistor Q73 of the second bias circuit 82 is configured to be connected in common to an NMOS transistor Q83 and an NMOS transistor Q93 of the amplification circuit 90 and transfer the low level output voltage AVSS. Pre-emphasis in the second bias circuit 82 is enabled as the bias signal NBIAS is transferred to the gate of the NMOS transistor Q73 by the activation of the enable signal PE_ENB.

The first amplification circuit of the amplification circuit 90 is configured by a differential amplification circuit which is operated in the first mode, and is configured to amplify the first differential transmission signal OUTP and the second differential transmission signal OUTN to a first amplification degree by the first pre-emphasis control signals INP_L, INN_L, INP_D_L and INN_D_L. Transistors Q80 to Q85 and Q90 to Q95 to the gates of which the first pre-emphasis control signals INP_L, INN_L, INP_D_L and INN_D_L are applied are included in the first amplification circuit.

More specifically, the PMOS transistor Q80 to the gate of which the first pre-emphasis control signal INN_L is applied and the PMOS transistor Q81 to the gate of which the first pre-emphasis control signal INP_D_L is applied are configured in series for the output of a high level, and the NMOS transistor Q82 to the gate of which the first pre-emphasis control signal INP_D_L is applied and the NMOS transistor Q83 to the gate of which the first pre-emphasis control signal INN_L is applied are configured in series for the output of a low level. In addition, the PMOS transistor Q84 and the NMOS transistor Q85 which are connected in series are configured between a node between the PMOS transistor Q80 and the PMOS transistor Q81 and a node between the NMOS transistor Q82 and the NMOS transistor Q83, and the first pre-emphasis control signal INN_D_L is applied to the gates of the PMOS transistor Q84 and the NMOS transistor Q85.

The PMOS transistor Q90 to the gate of which the first pre-emphasis control signal INP_L is applied and the PMOS transistor Q91 to the gate of which the first pre-emphasis control signal INN_D_L is applied are configured in series for the output of a high level, and the NMOS transistor Q92 to the gate of which the first pre-emphasis control signal INN_D_L is applied and the NMOS transistor Q93 to the gate of which the first pre-emphasis control signal INP_L is applied are configured in series for the output of a low level. In addition, the PMOS transistor Q94 and the NMOS transistor Q95 which are connected in series are configured between a node between the PMOS transistor Q90 and the PMOS transistor Q91 and a node between the NMOS transistor Q92 and the NMOS transistor Q93, and the first pre-emphasis control signal INP_D_L is applied to the gates of the PMOS transistor Q94 and the NMOS transistor Q95.

The PMOS transistor Q84, the NMOS transistor Q85, the PMOS transistor Q94 and the NMOS transistor Q95 are to be cross-coupled for amplification. To this end, a node between the PMOS transistor Q84 and the NMOS transistor Q85 and a node between the PMOS transistor Q94 and the NMOS transistor Q95 are electrically connected.

In the above configuration, a node between the PMOS transistor Q81 and the NMOS transistor Q82 is connected to the first node N1, and a node between the PMOS transistor Q91 and the NMOS transistor Q92 is connected to the second node N2.

As a result, the first amplification circuit of the amplification circuit 90 performs pre-emphasis for the first mode by differentially amplifying the first differential transmission signal OUTP and the second differential transmission signal OUTN to the first amplification degree by the first pre-emphasis control signals INP_L, INN_L, INP_D_L and INN_D_L.

The second amplification circuit of the amplification circuit 90 is configured to amplify the first differential transmission signal OUTP and the second differential transmission signal OUTN to a second amplification degree by the second pre-emphasis control signals INP_D_C and INN_D_C in the second mode.

The second amplification circuit includes an NMOS transistor Q88 which is connected to the first node N1 and an NMOS transistor Q98 which is connected to the second node N2.

In the above configuration, the NMOS transistor Q88 is connected to the first node N1, and the NMOS transistor Q98 is connected to the second node N2.

As a result, the second amplification circuit of the amplification circuit 90 performs pre-emphasis for the second mode by differentially amplifying the first differential transmission signal OUTP and the second differential transmission signal OUTN to the second amplification degree by the second pre-emphasis control signals INP_D_C and INN_D_C.

In the case where the pre-emphasis function is turned on in the second mode, the third current source 72 is connected to the low level output circuit 32 to reinforce a current capacity.

The third current source 72 is for providing a third current path having a third current capacity to the low level output circuit 32 in parallel with the first current source 40.

The third current source 72 includes a PMOS transistor Q76 to the gate of which the switching signal MS_PE is applied, and an NMOS transistor Q75 for providing a current path to the low level output circuit 32. The switching signal MS_PE turns on the PMOS transistor Q76 in the case where the pre-emphasis function is performed in the second mode. If the PMOS transistor Q76 is turned on, the NMOS transistor Q75 is turned on by the bias signal NBIAS applied to the gate thereof, thereby providing the current path. The third current source 72 is turned on in the case where the pre-emphasis function is performed in the second mode, thereby providing the current path formed in parallel with the current path of the first current source 40.

By being configured as described above, the embodiment in accordance with the present disclosure may perform an operation of outputting the first differential transmission signal OUTP and the second differential transmission signal OUTN in correspondence to the first differential data signal DP and the second differential data signal DN in the LVDS mode (the first mode) or the CML mode (the second mode).

The above-described modes may be selected by option signals provided from a memory, and the data transmission circuit implemented by the present disclosure may perform a selected mode in a combo type by the option signals provided in consideration of an interface and an application.

Figure 6:
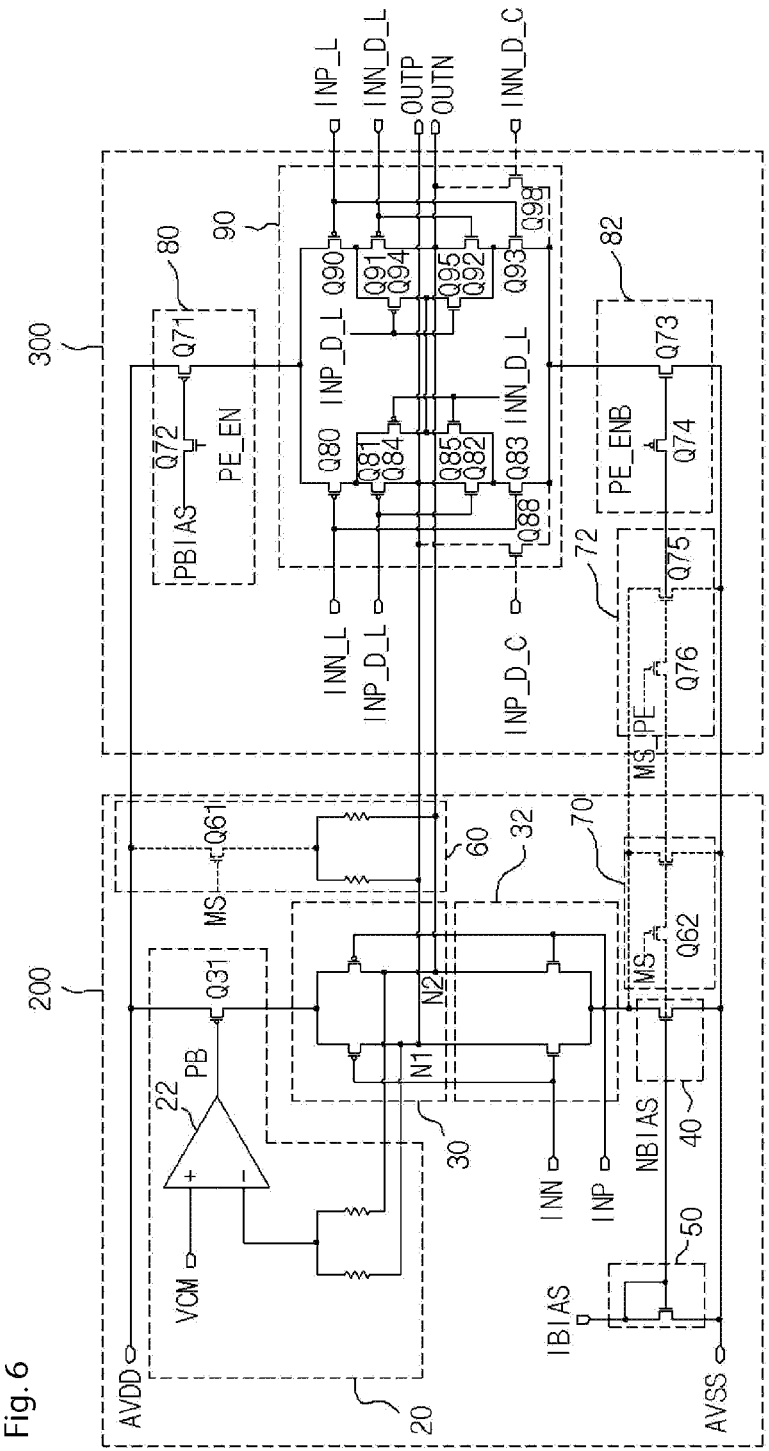
FIG. 6 is a detailed circuit diagram illustrating a representation of an example of a state in which the data transmission circuit in accordance with the embodiment of the disclosure operates in an LVDS mode.

First, a case where the data transmission circuit is operated in the LVDS mode (the first mode) will be described below with reference to FIG. 6.

In the first mode, the NMOS transistor Q61 of the second high level output circuit 60 and the PMOS transistor Q62 of the second current source 70 of the main driver 200 are turned off by the switch signal MS.

Therefore, in the first mode, the main driver 200 may perform then operation of outputting the first differential transmission signal OUTP and the second differential transmission signal OUTN by the first high level output circuit 30 and the low level output circuit 32. The current path for the operation of the low level output circuit 32 may be provided as the first current capacity by the first current source 40. The first current capacity may be understood as a current capacity required in the first mode.

In the case where the pre-emphasis function is selected in the first mode, the pre-emphasis driver 300 performs pre-emphasis of amplifying the first differential transmission signal OUTP and the second differential transmission signal OUTN to the first amplification degree by the first amplification circuit of the amplification circuit 90 which is operated by the first pre-emphasis control signals INP_L, INN_L, INP_D_L and INN_D_L. At this time, the transistors Q80 to Q85 and Q90 to Q95 included in the first amplification circuit are activated by the first pre-emphasis control signals INP_L, INN_L, INP_D_L and INN_D_L, and the transistors Q88 and Q98 included in the second amplification circuit are in the turned-off state.

Figure 7:
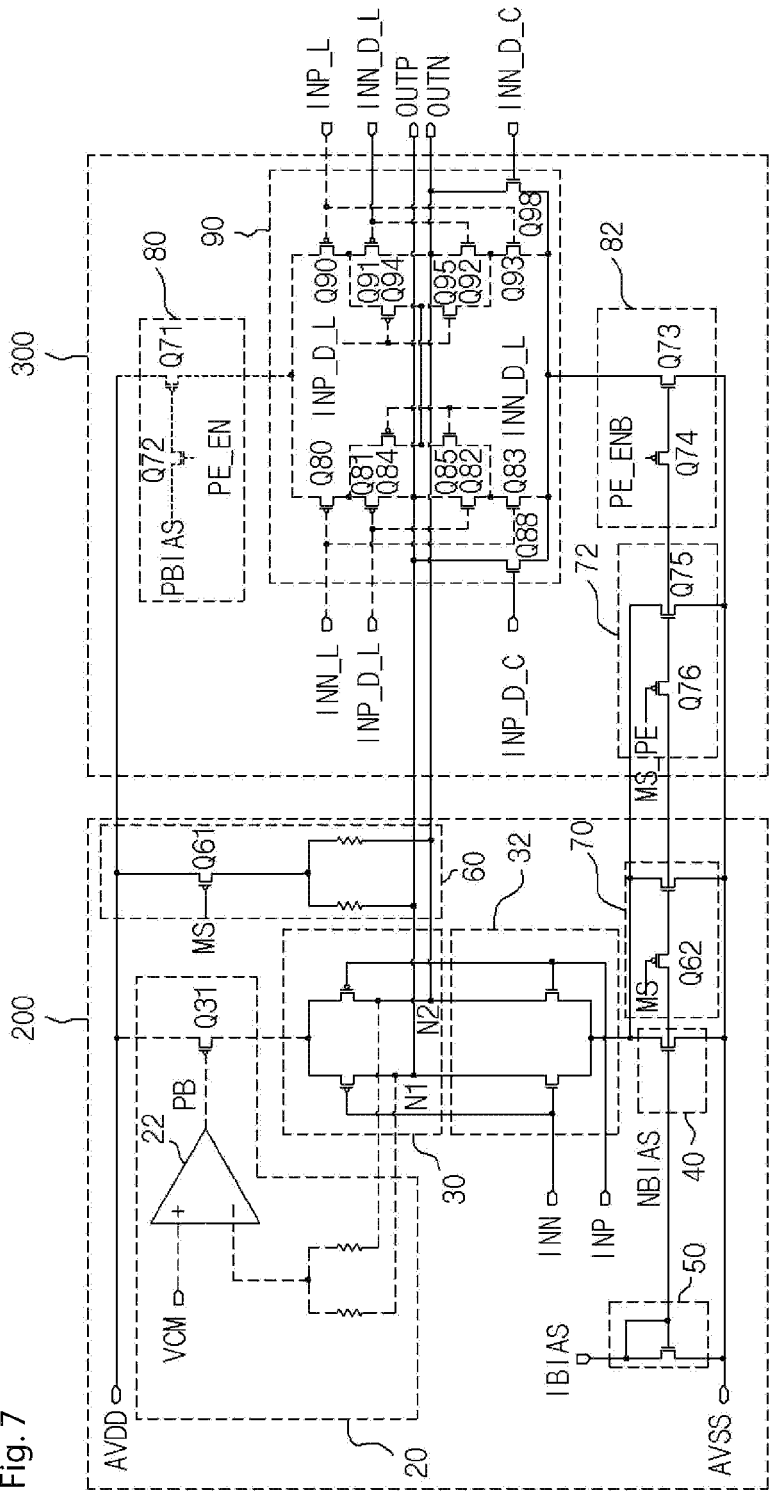
FIG. 7 is a detailed circuit diagram illustrating a representation of an example of a state in which the data transmission circuit in accordance with the embodiment of the disclosure operates in a CML mode.

Second, a case where the data transmission circuit is operated in the CML mode (the second mode) will be described below with reference to FIG. 7.

In the second mode, the NMOS transistor Q61 of the second high level output circuit 60 and the PMOS transistor Q62 of the second current source 70 of the main driver 200 are turned on by the switch signal MS. That is to say, the second high level output circuit 60 and the second current source 70 are activated.

In the case of the CML mode, voltages which are formed at the first node N1 and the second node N2 of the main driver 200 are formed higher than the reference voltage VCM. Thus, in the feedback circuit 20, the PMOS transistor Q31 is turned off by the comparison signal PB of the comparator 22. In other words, the high level output current path of the first high level output circuit 30 by the high level output voltage AVDD is blocked.

Therefore, in the second mode, the main driver 200 may perform an operation of outputting the first differential transmission signal OUTP and the second differential transmission signal OUTN by the second high level output circuit 60 and the low level output circuit 32.

The CML mode requires a current path of a larger current capacity than the LVDS mode. To this end, current paths for the operation of the low level output circuit 32 are formed in parallel by the first current source 40 and the second current source 70. The first current source 40 has the first current capacity, and the second current source 70 has the second current capacity. As a result, since the current path in which the first current capacity and the second current capacity are summed is provided to the low level output circuit 32, a current path having a capacity required in the CML mode may be provided.

In the case where the pre-emphasis function is selected in the second mode, the pre-emphasis driver 300 performs pre-emphasis of amplifying the first differential transmission signal OUTP and the second differential transmission signal OUTN to the second amplification degree by the second amplification circuit of the amplification circuit 90 which is operated by the second pre-emphasis control signals INP_D_C and INN_D_C. At this time, the transistors Q80 to Q85 and Q90 to Q95 of the first amplification circuit of the amplification circuit 90 are deactivated by the first pre-emphasis control signals INP_L, INN_L, INP_D_L and INN_D_L.

In the case where the pre-emphasis function is selected in the second mode, it is necessary to reinforce the current capacity of a current path by pre-emphasis.

The third current source 72 is activated to reinforce a current capacity in the case where the pre-emphasis function is turned on in the second mode, and thereby, provides the third current path having the third current capacity to the low level output circuit 32 in parallel with the first current source 40. As a result, since the current path in which the first current capacity to the third current capacity are summed is provided to the low level output circuit 32, a current path having a capacity required in the CML mode in the case where pre-emphasis is performed in parallel may be provided.

Accordingly, the embodiment of the present disclosure may provide a combo function for outputting differential transmission signals. As a consequence, an option may be selected in consideration of an interface or an application, and the embodiment of the present disclosure may have compatibility with the interface or the application.

In addition, the embodiment of the present disclosure is designed to share some circuits such as a low level output circuit, thereby providing advantages in that it is possible to reduce a chip size and to provide a current path having a variable current capacity depending on a change in mode and the application of pre-emphasis.

While various embodiments have been described above, it will be understood to those skilled in the art that the embodiments described are by way of example only. Accordingly, the disclosure described herein should not be limited based on the described embodiments.

What is claimed is:

1. A data transmission circuit comprising:
a pre-driver configured to output a first differential driving signal and a second differential driving signal by amplifying a first differential data signal and a second differential data signal; and
a main driver configured to output a first differential transmission signal and a second differential transmission signal by utilizing the first differential driving signal and the second differential driving signal,
wherein the main driver performs output of a high level and output of a low level in correspondence to a first mode, by utilizing a first high level output circuit and a low level output circuit which are operated by the first differential driving signal and the second differential driving signal,
wherein the main driver performs output of a high level and output of a low level in correspondence to a second mode, by utilizing a second high level output circuit which utilizes internal termination resistors and the low level output circuit which is operated by the first differential driving signal and the second differential driving signal, and
wherein the main driver includes a current source which provides current paths having different current capacities to the low level output circuit shared by the first high level output circuit and the second high level output circuit, depending on a mode.

2. The data transmission circuit according to claim 1, wherein the first mode and the second mode are defined as modes that require different current capacities.

3. The data transmission circuit according to claim 2, wherein the first mode is a low voltage differential signaling (LVDS) mode, and the second mode is a current mode logic (CML) mode.

4. The data transmission circuit according to claim 1, wherein the pre-driver comprises:
a first mode pre-driver enabled in correspondence to the first mode, and configured to amplify the first differential data signal and the second differential data signal to satisfy a first specification; and
a second mode pre-driver enabled in correspondence to the second mode, and configured to amplify the first differential data signal and the second differential data signal to satisfy a second specification.

5. The data transmission circuit according to claim 1, wherein the second high level output circuit has a fixed output capacity which is determined by the internal termination resistors.

6. The data transmission circuit according to claim 1, wherein the current source comprises:
a first current source configured to provide a first current path having a first current capacity to the low level output circuit; and
a second current source enabled in the second mode, and configured to provide a second current path having a second current capacity to the low level output circuit in parallel with the first current source, wherein the current paths having different current capacities are provided depending on whether the second current source is enabled.

7. The data transmission circuit according to claim 1, wherein the main driver comprises:
the first high level output circuit applied with a high level output voltage in the first mode, and configured to perform a high level output operation by the first differential driving signal and the second differential driving signal;
a feedback circuit configured to feed back the first differential transmission signal and the second differential transmission signal, and block the high level output voltage from being applied to the first high level output circuit in the second mode in which a feedback voltage is higher than a reference voltage;
the second high level output circuit having the internal termination resistors to which the high level output voltage is applied in the second mode, and configured to perform a high level output operation by utilizing the internal termination resistors;
the low level output circuit shared by the first high level output circuit and the second high level output circuit through a first node which outputs the first differential transmission signal and a second node which outputs the second differential transmission signal, and configured to perform a low level output operation by the first differential driving signal and the second differential driving signal; and
the current source configured to provide the current paths having different current capacities to the low level output circuit in correspondence to the first mode and the second mode.

8. The data transmission circuit according to claim 7, wherein the feedback circuit includes a first transistor which is turned on depending on a result of comparing the feedback voltage and the reference voltage;
wherein the first high level output circuit includes a second transistor which receives the high level output voltage through the first transistor and is operated by the first differential driving signal, and a third transistor which receives the high level output voltage in parallel with the second transistor and is operated by the second differential driving signal;
wherein the second high level output circuit includes a first termination resistor and a second termination resistor to which the high level output voltage is applied in the second mode and which are connected in parallel; and
wherein the low level output circuit includes a fourth transistor which is connected to the second transistor and the first termination resistor through the first node and is operated by the first differential driving signal, and a fifth transistor which is connected to the third transistor and the second termination resistor through the second node and is operated by the second differential driving signal.

9. A data transmission circuit comprising:
a pre-driver configured to output a first differential driving signal, a second differential driving signal and pre-emphasis control signals by amplifying a first differential data signal, a second differential data signal and option signals;
a main driver configured to output a first differential transmission signal and a second differential transmission signal by utilizing the first differential driving signal and the second differential driving signal; and a pre-emphasis driver configured to perform pre-emphasis on the first differential transmission signal and the second differential transmission signal to different amplification degrees in a first mode and a second mode by the pre-emphasis control signals,
wherein the main driver performs output of a high level and output of a low level in correspondence to the first mode, by utilizing a first high level output circuit and a low level output circuit which are operated by the first differential driving signal and the second differential driving signal,
wherein the main driver performs output of a high level and output of a low level in correspondence to the second mode, by utilizing a second high level output circuit which utilizes internal termination resistors and the low level output circuit which is operated by the first differential driving signal and the second differential driving signal, and
wherein the main driver includes a current source which provides current paths having different current capacities to the low level output circuit shared by the first high level output circuit and the second high level output circuit, depending on a mode.

10. The data transmission circuit according to claim 9, wherein the first mode and the second mode are defined as modes that require different current capacities.

11. The data transmission circuit according to claim 10, wherein the first mode is a low voltage differential signaling (LVDS) mode, and the second mode is a current mode logic (CML) mode.

12. The data transmission circuit according to claim 9, wherein the pre-driver comprises:
a first mode pre-driver enabled in correspondence to the first mode, and configured to amplify the first differential data signal and the second differential data signal to satisfy a first specification, and to output first pre-emphasis control signals, for the first mode, corresponding to the first differential data signal, the second differential data signal and the option signals; and
a second mode pre-driver enabled in correspondence to the second mode, and configured to amplify the first differential data signal and the second differential data signal to satisfy a second specification, and to output second pre-emphasis control signals, for the second mode, corresponding to the option signals.

13. The data transmission circuit according to claim 12, wherein the pre-emphasis driver comprises:
a first amplification circuit configured to amplify the first differential transmission signal and the second differential transmission signal to a first amplification degree by the first pre-emphasis control signals in the first mode; and
a second amplification circuit configured to amplify the first differential transmission signal and the second differential transmission signal to a second amplification degree by the second pre-emphasis control signals in the second mode,
wherein the first amplification circuit and the second amplification circuit perform the pre-emphasis on the first differential transmission signal and the second differential transmission signal, by being connected in common to a first node and a second node.

14. The data transmission circuit according to claim 13, further comprising:
a first bias circuit configured to transfer a high level output voltage to the first amplification circuit when the pre-emphasis is enabled; and a second bias circuit configured to transfer a low level output voltage to the first amplification circuit and the second amplification circuit when the pre-emphasis is enabled.

15. The data transmission circuit according to claim 9, wherein the second high level output circuit has a fixed high level output capacity which is determined by the internal termination resistors.

16. The data transmission circuit according to claim 9, wherein the current source comprises:
 a first current source configured to provide a first current path having a first current capacity to the low level output circuit; and
 a second current source enabled in the second mode, and configured to provide a second current path having a second current capacity to the low level output circuit in parallel with the first current source; and
 a third current source enabled when the pre-emphasis is enabled, and configured to provide a third current path having a third current capacity to the low level output circuit in parallel with the first current source,
 wherein the current paths having different current capacities are provided depending on whether the second current source and the third current source are enabled.

17. The data transmission circuit according to claim 9, wherein the main driver comprises:
 the first high level output circuit applied with a high level output voltage in the first mode, and configured to perform a high level output operation by the first differential driving signal and the second differential driving signal;
 a feedback circuit configured to feed back the first differential transmission signal and the second differential transmission signal, and block the high level output voltage from being applied to the first high level output circuit in the second mode in which a feedback voltage is higher than a reference voltage;
 the second high level output circuit having the internal termination resistors to which the high level output voltage is applied in the second mode, and configured to perform a high level output operation by utilizing the internal termination resistors;
 the low level output circuit shared by the first high level output circuit and the second high level output circuit through a first node which outputs the first differential transmission signal and a second node which outputs the second differential transmission signal, and configured to perform a low level output operation by the first differential driving signal and the second differential driving signal; and
 the current source configured to provide the current paths having different current capacities to the low level output circuit in correspondence to the first mode and the second mode.

18. The data transmission circuit according to claim 17,
 wherein the feedback circuit includes a first transistor which is turned on depending on a result of comparing the feedback voltage and the reference voltage;
 wherein the first high level output circuit includes a second transistor which receives the high level output voltage through the first transistor and is operated by the first differential driving signal, and a third transistor which receives the high level output voltage in parallel with the second transistor and is operated by the second differential driving signal;
 wherein the second high level output circuit includes a first termination resistor and a second termination resistor to which the high level output voltage is applied in the second mode and which are connected in parallel; and
 wherein the low level output circuit includes a fourth transistor which is connected to the second transistor and the first termination resistor through the first node and is operated by the first differential driving signal, and a fifth transistor which is connected to the third transistor and the second termination resistor through the second node and is operated by the second differential driving signal.

19. The data transmission circuit according to claim 9, further comprising:
 an external memory configured to store the option signals,
 wherein the external memory provides an option signal corresponding to a mode selected between the first mode and the second mode.

* * * * *